United States Patent
Wu et al.

(10) Patent No.: US 7,920,263 B2
(45) Date of Patent: Apr. 5, 2011

(54) APPARATUS AND SYSTEM FOR ELECTRO MAGNETIC FIELD MEASUREMENTS AND AUTOMATIC ANALYSES OF PHASE MODULATED OPTICAL SIGNALS FROM ELECTROOPTIC DEVICES

(75) Inventors: Dong Ho Wu, Olney, MD (US); Anthony Garzarella, Ellicott City, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 334 days.

(21) Appl. No.: 12/205,766

(22) Filed: Sep. 5, 2008

(65) Prior Publication Data

US 2009/0066952 A1   Mar. 12, 2009

Related U.S. Application Data

(60) Provisional application No. 60/970,367, filed on Sep. 6, 2007.

(51) Int. Cl.
G01J 4/00      (2006.01)
G01R 31/00     (2006.01)

(52) U.S. Cl. .............................. 356/365; 324/96
(58) Field of Classification Search .................... 324/753
See application file for complete search history.

(56) References Cited

U.S. PATENT DOCUMENTS

| | | | |
|---|---|---|---|
| 4,563,093 A | | 1/1986 | Tada et al. |
| 5,278,499 A | * | 1/1994 | Ito et al. ............ 324/244.1 |
| 5,305,136 A | | 4/1994 | Smith |
| 5,737,082 A | | 4/1998 | Itatani et al. |
| 5,963,034 A | * | 10/1999 | Mahapatra et al. ............ 324/96 |
| 6,353,494 B1 | * | 3/2002 | Hamada .......................... 359/322 |
| 6,404,538 B1 | * | 6/2002 | Chen et al. ..................... 359/323 |
| 6,621,258 B2 | * | 9/2003 | Davidson et al. ............... 324/96 |
| 7,336,062 B2 | * | 2/2008 | Mitrofanov ..................... 324/96 |
| 2002/0036491 A1 | * | 3/2002 | Whitaker et al. ............... 324/96 |
| 2003/0117126 A1 | * | 6/2003 | Rahmatian ...................... 324/96 |
| 2005/0083535 A1 | | 4/2005 | Kamshilin et al. |
| 2006/0152209 A1 | | 7/2006 | Sasaki et al. |

OTHER PUBLICATIONS

A. Garzarella and Dong Ho Wu; Nonperturbative detection of high power microwaves using fiber attached electro-optic sensors (I); 2008; pp. 1-4; Optical Society of America; USA.

(Continued)

*Primary Examiner* — Gregory J Toatley
*Assistant Examiner* — Juan D Valentin
(74) *Attorney, Agent, or Firm* — John Leonard Young; Amy L. Ressing

(57) ABSTRACT

An apparatus, for measuring an electric field while minimally perturbing the electric field being measured, includes an analyzing stage and a sensor head. The sensor head is optically coupled to the analyzing stage by a laser probe beam transmitted from the analyzing stage. The sensor head includes an electro optic crystal disposed between two gradient index lenses, where the first gradient index lens emits a laser beam transmitted from the analyzing stage to the sensor head, where the electric field is applied and where, the electro optic crystal transforms the laser beam probe into a phase modulated laser beam. The second gradient index lens transmits the phase modulated laser beam back to the analyzing stage, where polarization optics and a photodetector convert the phase modulated laser beam into an electrical signal representing field strength and phase of the electric field.

19 Claims, 7 Drawing Sheets

OTHER PUBLICATIONS

A. Garzarella and Dong Ho Wu; Nonperturbative detection of high power microwaves using fiber attached electro-optic sensors (II); 2008; pp. 1-17; CLEO; USA.

A. Garzarella and Dong Ho Wu; Nonperturbative, 3-axis electric field measurements using electro-optic sensors (III); Jul. 2-6, 2008; pp. 1-23: PIERS; Cambridge, USA.

A. Garzarella and Dong Ho Wu; Abstract Nonperturbative, 3-axis electric field measurements using electro-optic sensors (IV); Jul. 2-6, 2008; pp. 1; PIERS; Cambridge, USA.

A. Garzarella and Dong Ho Wu; Non Perturbing Electric Field Measurements Using Photorefractive Electro-optic Sensors; Sep. 25-27, 2007; pp. 1-18 (Slides); ASNR; Gramat, France.

Wu, Garzarella, and Wieting; Ultra broadband electro-optic field-sensor; Aug. 7-10, 2006; pp. 1-4; Conference Proceedings of ITEA Technology Review, Cambridge, MA; USA.

Wu, Garzarella, and Wieting; Ultra broadband electro-optic field-sensor; 2006; pp. 1-10 (Slides); ASNR Conference Proceedings.

Garzarella, Qadri, Wieting and Wu; Spatial and termporal sensitivity variations in photorefractive electro-optic field sensors; Applied Physics Letters 88; Apr. 5, 2006; pp. 141106-1 and 141106-2; USA.

Garzarella, Qadri, Wieting and Wu; Piezo-induced sensitivity enhancements in electro-optic field sensors; Applied Physics Letters 98; Aug. 25, 2005; pp. 043113-1 and 0431136-2; USA.

Garzarella, Qadri, Wieting and Wu; The effects of photorefraction on electro-optic field sensors; Applied Physics Letters 97; Jun. 10, 2005; pp. 113108-1 and 113108-5; USA.

S. Sriram; High Frequency Electric Field Sensors using Thin-Film Electro-optical Ferroelectric Relaxors; Jun. 2008; pp. 1-7; Columbus, OH, USA.

Wu, Garzarella, and Wieting; Electro-optic field sensor development at the U.S. Naval Research Laboratory at Four Power ASNR HPM LTTP Technical Meeting in Germany; Apr. 5, 2006; pp. 1-36 (Slides);Germany.

A. Garzarella et al. "Responsivity optimization and stabilization in electro-optic field sensors", Applied Optics, vol. 46, Issue 26, pp. 6636-6640, Sep. 10, 2007.

* cited by examiner

APPARATUS AND SYSTEM FOR ELECTRO MAGNETIC FIELD MEASUREMENTS AND AUTOMATIC ANALYSES OF PHASE MODULATED OPTICAL SIGNALS FROM ELECTROOPTIC DEVICES

CROSS REFERENCE TO RELATED APPLICATIONS

The present application is a nonprovisional application of provisional application No. 60/970,367 filed Sep. 6, 2007 under 35 USC 119(e), the entire disclosure of which is incorporated by reference herein.

FIELD OF THE INVENTION

The present invention is generally related to test and evaluation of high power microwave emissions and optical beam modulation devices. In particular the present invention is directed to an electromagnetic field sensor and an automatic analyzer therefore.

BACKGROUND OF THE INVENTION

Presently D dot and B dot sensor probes are used for high power microwave (HPM) tests and evaluations, wherein a D dot sensor is a dipole antenna based device capable of measuring an electric field, while a B dot sensor is a coil or loop based device used for measuring a magnetic field. Limitations and disadvantages of these conventional sensors include: (1) unacceptably large field perturbations, (2) narrow bandwidth, and (3) bulky physical size. Both the D dot and the B dot sensors perturb the very fields that they measure, based on the metallic composition of the sensors. The large field perturbations render these sensors unable to measure true waveform of the electric and magnetic fields. These conventional sensors have a very narrow frequency bandwidth (typically less than 1 GHz) and hence they are not suitable for wideband HPM test and evaluation. Also, the conventional electric field sensor (D dot sensor) is large in size, and thus unable to measure detailed field patterns in small areas.

The problems associated with conventional electric field sensors can be addressed with electro optic field sensors. Electro optic sensors are small in size and have large intrinsic bandwidths (dc to terahertz). Additionally, they contain no metallic parts and are therefore minimally perturbative to external electric fields. The principle of operation of an electro optic field sensors is based on the linear electro optic effect (also known as the Pockels effect), where an electric field modulates the birefringence of an electro optic material (electro optic crystal or electro optic polymer).

In an electro optic field sensor, a laser probe beam, analyzing optics and a photodetector are used to convert the modulation of birefringence (produced by the applied field and the electro optic effect in the crystal) into a modulated electrical output signal from which the applied field can be inferred. This process is accomplished as follows: In the absence of an applied field, the laser probe passes through the crystal and acquires a phase delay due to the natural birefringence of the crystal. The beam then exits the crystal and passes through an analyzer, consisting of a polarizer which may be preceded with one or more wave retardation plates. The amount of beam power transmitted through the analyzer depends on the phase delay (or equivalently, the polarization state) within the beam. When an external electric field is applied to the crystal, the modulation of birefringence results in a modulation in the phase (or equivalently, the polarization state) of the probe beam, thereby modulating the amount of beam power transmitted through the analyzer. Thus the phase-modulated laser beam is converted into an intensity-modulated optical output signal. By measuring the amplitude and phase of the output optical modulation signal using a photodetector and readout instruments (which convert the optical signal into an electrical signal), the amplitude and phase of the applied electric field can be determined.

However, a major problem with electro optic field sensors is that the optical modulation signal can undergo fluctuations and drifts in its amplitude and phase, even if the applied field has a steady state amplitude and phase. These fluctuations and drifts are due to temperature-induced and photo-induced changes in the natural birefringence of the electro optic material. Because of these fluctuations, precise field measurements become difficult or impossible. This instability problem is likely to be a major reason why little effort has been made to commercialize the use of electro optic field sensors in field measurement applications.

The fluctuations and drift problems in electro optic materials not only affect electro optic field sensors, but also electro optic modulators (which operate in a nearly identical manner as field sensors). In electro optic modulator applications, a known electric field is applied via electrodes to an electro optic material. A drive voltage is then applied across the electrodes, which induces a phase modulation in a probe beam passing through the electro optic material. Analyzing optics are then used to convert the phase modulation into an intensity modulated optical output signal. As in the case of electro optic sensors, drifts and fluctuations can occur in the amplitude and phase of the optical modulation signal, even if the drive voltage has a steady state amplitude and phase. As a result, measures must be taken to compensate for these fluctuations, such as varying the amplitude and phase of the drive voltage signal.

In electro optic field sensors and modulators, the fluctuations and drift in the optical output signal can be reduced by continuous adjustments of the rotation angle of the polarizer in the analyzing optics. Such a technique can improve the stability of the responsivity to a certain degree; however, continuous manual adjustments are cumbersome and can not always recover the signal loss. No device hitherto exists to eliminate these instabilities and keep the device stably operating at its peak responsivity.

Therefore, the need exists for an electric field sensor that is capable of nonperturbative measurements of the amplitude and phase of electric fields over a wide frequency bandwidth that can stably operate at its peak responsivity.

Further, the need exists for devices and systems directed to analyzing a phase modulated laser beam that has passed through an electro optic material in an electric field (produced externally or by a voltage difference across electrodes), and converting it into an intensity modulated optical signal such that the amplitude of the intensity modulation does not fluctuate or drift as the natural birefringence of the electro optic material varies.

SUMMARY OF THE INVENTION

An apparatus, for wide bandwidth, nonperturbative measurements of an external electric field, includes an analyzing stage and a sensor head. The sensor head is optically coupled to the analyzing stage by optical fiber leads. The analyzing stage includes a laser and polarization optics configured to measure the electric field applied to the sensor head by analyzing a laser beam that has passed through an electro optic crystal exposed to the electric field. The sensor head includes a plexiglass holder or any other non metallic material, an electro optic crystal disposed between a first gradient index lens and a second gradient index lens, also residing in the sensor head. The electro optic crystal and the first and second gradient index lenses are mounted in the plexiglass holder. A laser beam is transmitted from the analyzing stage to the first gradient index lens through a polarization maintaining optical fiber. The first gradient index lens emits a collimated and linearly polarized laser beam which passes through the electro optic crystal, received by the second gradient index lens, and is returned to the analyzer stage through a second polarization maintaining optical fiber. Upon reaching the analyzer stage, the beam is analyzed as it passes through a quarter wave retardation plate and a polarizer. The analyzed beam is then sent to a photodetector which converts the optical signal into an electrical signal that can be observed with a readout instrument and/or a measurement device such as an oscilloscope or spectrum analyzer. Upon application of the electric field, the laser probe beam is phase modulated via the electro optic effect in the crystal. When passed through the quarter wave retardation plate and polarizer, the phase modulated beam is converted into an optical modulation signal whose amplitude and phase represent the field strength and phase of the electric field applied to the sensor head. The rotation angle of the quarter wave retardation plate is fixed while the rotation angle of the polarizer is varied until the amplitude of the optical modulation signal (and therefore the sensor responsivity) is maximized and stabilized. This optimal rotation angle can be determined by the transmitted beam power level measured by the photodetector. The unique orientation of the crystal axis with respect to the fast/slow axes of the fiber optic cable and the fast/slow axes of the quarter wave retardation plate, as specified by this invention, allows the polarizer to maintain stable and maximum sensor responsivity regardless of fluctuations or drifts occurring in the birefringence of the crystal.

In a second embodiment of the invention, the fiber optics are replaced by free space optics. The analyzing stage includes a free space laser and free space polarization optics configured to measure the electric field applied to the sensor head, and stabilize temperature and photo-induced signal fluctuations. The sensor head includes a plexiglass holder, a quarter wave retardation plate, an electro optic crystal, and a dielectric mirror. The quarter wave retardation plate, electro optic crystal and dielectric mirror are mounted in the plexiglass holder. A linearly polarized laser beam is transmitted from the analyzing stage to the sensor head through free space. The sensor head is aligned with the laser beam such that the laser beam passes through the quarter wave retardation plate and electro optic crystal to a dielectric mirror, where it is reflected back through the electro optic crystal and quarter wave retardation plate before returning to the analyzer stage. Upon reaching the analyzer stage, the beam is analyzed as it passes through a polarizer. The analyzed beam is then sent to a photodetector which converts the optical signal into an electrical signal that can be observed with a readout instrument such as an oscilloscope or spectrum analyzer. Upon application of the electric field to the sensor head, the laser probe beam is phase modulated via the electro optic effect in the crystal. The phase modulated beam is analyzed by the quarter wave retardation plate and polarizer, and converted into an optical modulation signal whose amplitude and phase represent the field strength and phase of the electric field applied to the sensor head. The rotation angle of the polarizer varies automatically, such that the amplitude of the optical modulation signal (and therefore the sensor responsivity) is maximized and stabilized. This optimal rotation angle is determined by the transmitted beam power level measured by the photodetector. The unique orientation of the crystal axis with respect to the fast/slow axes of the quarter wave retardation plate, as specified by this invention, allows the polarizer to maintain stable and maximum sensor responsivity regardless of fluctuations or drifts occurring in the birefringence of the crystal.

DETAILED DESCRIPTION OF THE INVENTION

Figure 1:
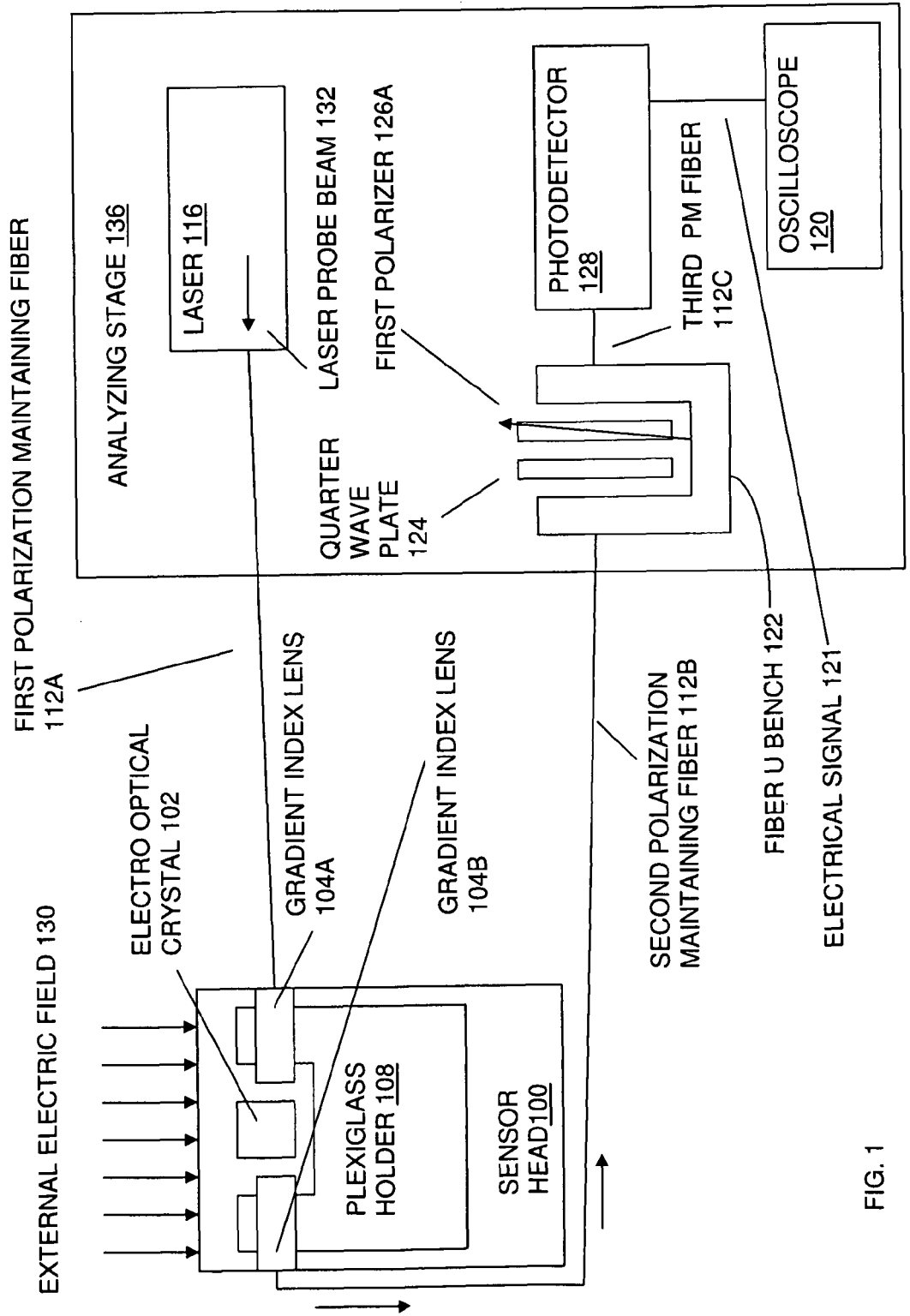
FIG. 1 illustrates an apparatus for measuring an applied electro magnetic field using a electro optic sensor head, an analyzing stage and optical fibers for transmitting a laser probe beam between the sensor head and the analyzing stage.

Preferred exemplary embodiments of the present invention are now described with reference to the figures, in which like reference numerals are generally used to indicate identical or functionally similar elements. While specific details of the preferred exemplary embodiments are discussed, it should be understood that this is done for illustrative purposes only. A person skilled in the relevant art will recognize that other configurations and arrangements can be used without departing from the spirit and scope of the preferred exemplary embodiments. It will also be apparent to a person skilled in the relevant art that this invention can also be employed in other applications. Devices and components, such as the laser, the photodetector and the readout devices described in the exemplary embodiments can be off the shell commercially available devices or specially made devices. Further, the terms "a", "an", "first", "second" and "third" etc. used herein do not denote limitations of quantity, but rather denote the presence of one or more of the referenced items(s).

Referring to FIG. 1, in accordance with a first exemplary embodiment, the optical fiber electro optic (EO) field sensor, which is complimentary to a free space EO sensor, is directed to the measurement of an external electric field 130 in a confined space with a minimal perturbation to the external electric field 130 being measured. In contrast to conventional field sensors, in the first exemplary embodiment, the sensor head 100 components of the EO field sensor are completely made of dielectric materials. Also, the sensor head 100 can be configured to use optical fiber leads such as a first polarization maintaining fiber 112A (the first PM Fiber 112A), a second polarization maintaining fiber 112B (the second PM Fiber 112B), and a third polarization maintaining fiber 112C (the third PM Fiber 112C) or a multi mode fiber to emit a measured signal to the various stages and components in the apparatus for measuring the external electric field 130 applied to the sensor head 100, causing negligible perturbation of the external electric field 130 by the sensor and optical fiber leads. Thus, the sensor head 100 of the first exemplary embodiment can be used for the test and evaluation of high power microwave (HPM) experiments, the diagnosis of radar and microwave devices (including microwave ovens), characterization of lightening and diagnosis of power lines, based on the negligible perturbation to the external electric field 130 being measured.

Again, referring to FIG. 1, a schematic diagram of the first exemplary embodiment is shown. The sensor head is placed in the external electric field 130 that is to be detected. A laser beam or probe beam (hereafter "laser probe beam 132") is emitted from a laser 116 residing in an analyzing stage (hereafter "analyzing stage 136") to the sensor head 100 through a polarization maintaining (PM) optical fiber, such as polarization maintaining fiber 112A (hereafter "PM fiber 112A"). The laser probe beam 132 passes through an electro optic crystal 102 (hereafter "EO crystal 102"), and returns to the analyzing stage 136 through the second polarization maintaining fiber 112B (hereafter "the second PM fiber 112B"). The laser probe beam 132 passes through a quarter wave retardation plate 124 (hereafter "quarter wave plate 124") (QWP) and an analyzer (a first polarizer 126A). A photodetector 128 then receives the laser probe beam 132 and converts the laser probe beam 132 into an electrical signal 121, which is displayed on an oscilloscope 120, or may be displayed on a spectrum analyzer or any other readout instrument or measurement device capable of measuring fast electrical signals. The amplitude of the electrical signal 121 will be proportional to the amplitude of the external electric field 130. The phase of the electrical signal 121 will precisely reproduce the phase of the external electric field 130 applied to the sensor head 100. Thus, for any time varying external field E(t), such as the external electric field 130, the electrical signal 121 output from the sensor will be $\alpha E(t)$, where $\alpha$ is a constant, depending on the laser power of the laser 116, conversion gain of the photodetector 128, and properties of the EO crystal 102. The quantity $\alpha$ is called the responsivity of the EO field sensor.

Referring to FIG. 1, in accordance with the first exemplary embodiment, the sensor head 100 consists of the EO crystal 102 and two gradient index (GRIN) lenses (hereafter "a first gradient index lens 104A" and "a second gradient index lens 104B"), all of which are mounted in a sample holder made of plexiglass (hereafter "plexiglass holder 108"). The total length of the sensor head 100 is approximately 3 cm (up to about 3 centimeters), which makes the sensor head 100 suitable to be placed in confined places, such as microwave wave guides.

In the first exemplary embodiment, again referring to FIG. 1, a first GRIN lens, i.e., the first gradient index lens 104A is used to emit the laser probe beam 132 from the polarization maintaining fiber 112A into a collimated free space beam passing through the EO crystal 102. The first gradient index lens 104A is oriented such that polarization occurs in the laser probe beam 132 at a forty-five (45) degree angle with respect to the EO crystal 102 optic axis (also referred to as the "c axis 310") of the EO crystal 102 (see FIG. 3); then the laser probe beam 132, which has been polarized, propagates parallel to the x or y axis of the EO crystal 102, (where the y axis is hereafter referred to as "y axis 302") (see FIG. 3). The function of the EO crystal 102 is to modulate the probe beam polarization. In the first exemplary embodiment, the crystal can be composed of Lithium Niobate, or any other EO material with sufficient EO modulating power. In the absence of the external electric field 130 applied, the natural birefringence of the EO crystal 102 converts the polarization state ($\phi$) of the laser probe beam 132 from linearly polarized ($\phi=0$) to elliptically polarized ($\phi=\phi_0$), (where birefringence is a state of double refraction exhibited by the decomposition of a ray of light into two rays of light, i.e., the ordinary ray of light and the extraordinary ray of light) caused when the original ray of light, such as from the laser probe beam 132, passes through certain types of material, such as the EO crystal 102, depending on the polarization of the light, when the structure of the EO crystal 102 is anisotropic (i.e., directionally dependent). Birefringence can be formalized by assigning two different refractive indices to the material of the EO crystal 102 for different polarizations. When the sensor head 100 is placed in the external electric field 130, a small shift occurs in this elliptical polarization state ($=\phi_0+\delta\phi$), which is eventually converted to the electrical signal 121 at the analyzer stage (such as the analyzer stage 136) downstream. A second GRIN lens (such as the second gradient index lens 104B) collects the phase modulated beam 400 (see FIG. 4 and FIG. 5), and launches the phase modulated beam 400 into a PM fiber (such as the second PM fiber 112B that carries the laser probe beam 132 back to the analyzing stage 136. To optimize responsivity and the function of the automated analyzer, the second PM fiber 112B must be oriented with either a fast axis or slow axis aligned with (parallel to) the optic axis of the crystal.

Referring again to the analyzing stage 136 of the first exemplary embodiment, as illustrated in FIG. 1, the laser 116 utilized for the EO field sensor can range from 1 to 20 mW (milliwatts) in power and 530 to 1550 nm (nanometers) in wavelength. The laser probe beam 132 returning from the sensor head 100 is sent through the second PM fiber 112B to a fiber U bench 122. At the fiber U bench 122, the laser probe beam 132 exits the fiber and passes (in free space) through a quarter wave plate 124 and the analyzer (the first polarizer 126A). Referring to FIG. 1, FIG. 2, FIG. 3, and FIG. 5, the quarter wave plate 124 is oriented with its fast and/or slow (fast/slow) axes at 45 degree angles with respect to the fast and/or slow (fast/slow) axes of the second PM fiber 112B to optimize responsivity. The analyzer (i.e., the first polarizer 126A) converts the shift in probe beam polarization (created by the external electric field 130) into a modulation of beam intensity $\Delta P$. For optimal sensitivity, the position of the analyzer (i.e., the first polarizer 126A) must be calibrated (i.e., rotated) to optimize the modulation. The optimal set point of the analyzer (i.e., the first polarizer 126A) can be determined actively or passively. The sensor is actively calibrated by rotating the first polarizer 126A (manually or though an automated rotation stage) until the amplitude of the electrical signal 121 output from the photodetector 128 is maximized. Because of the unique design of the sensor, the rotational position of the analyzer that achieves maximum signal amplitude will always coincide with the position in which the midpoint of the total beam power (one half of the maximum value plus one half of the minimum value, hereafter designated as the "half transmittance point") is transmitted through the first polarizer 126A to the photodetector 128, regardless of the polarization state $\phi_0$ of the laser probe beam 132. Since most commercial photodetectors have current monitors for measuring the beam power received by the photodiode, an alternative method to calibrate the sensor is to simply rotate the first polarizer 126A until the half transmittance point (as measured by the photodiode current monitor of the photodetector 128) is reached. In contrast to active calibration, which requires the sensor head 100 be placed in the external electric field 130 applied for measurement, this latter method of passive calibration can be performed in the absence of the external electric field 130. As the birefringence of the EO crystal 102 drifts, the polarization state $\phi_0$ of the laser probe beam 132 will be changed along with the transmitted beam power reaching the photodetector 128. When this occurs, the calibration of the EO sensor must be restored by adjusting the analyzer (i.e., the first polarizer 126A) until one half of the total beam power is once again transmitted to the photodetector 128. To avoid the cumbersome task of continuous manual adjustments of the analyzer, an automated rotation stage (such as a motorized rotation stage 544) can be used to constantly adjust the analyzer (i.e., the first polarizer 126A) to the half transmittance point, ensuring that the calibration of the EO sensor is sustained automatically.

When the EO sensor is calibrated (half transmittance point attained by adjustment of the first polarizer 126A) the modulation $\Delta P$ is at its peak value, given by:

$$\Delta P = P_0 \frac{\pi L n^3 r_{33}}{3\lambda} E, \quad (1)$$

where $P_0$ is the power of the laser probe beam 132 passing through the EO crystal 102, and L is the total optical path length of the laser probe beam 132 within the EO crystal 102, where n is the refractive index of the EO crystal 102, where $r_{33}$ is the electro optic coefficient of the EO crystal 102, where $\lambda$ is the wavelength of the laser probe beam 132 emitted from the laser 116, and E is the value of the external electric field 130. For $P_0$=1 mW, L=8 mm, n=2.2, $r_{33}$=25 pm/V and $\lambda$=1550 nm (these are typical operating parameters), the modulation per unit field, $\Delta P/E$ evaluates to be approximately 0.3 µW/kV/m. The peak modulation described by Equation (1) reflects the maximum modulating power of the sensor, and is independent of the polarization state $\phi_0$ of the LASER probe beam 132 exiting the EO crystal 102. The significance of this result is that $\Delta P$ in Equation (1) is not affected by drifts and fluctuations of birefringence in the EO crystal 102. Thus the modulation signal will be stable and maximized as long as the calibration of the EO sensor is sustained. The validity of Equation (1) is contingent on the use of the quarter wave retardation plate (such as the quarter wave plate 124) and the relative alignments of the optic axis (such as the C Axis 310) of the EO crystal 102, fast/slow axes of the optical fibers (such as the first polarization maintaining fiber 112A the second polarization maintaining fiber 112B, and the third PM fiber 112C) as specified by the design of the exemplary embodiments. Thus the design parameters of the exemplary embodiments are critical in eliminating the problem of signal fluctuations associated with variations of birefringence in EO sensors.

Again referring to FIG. 1, the photodetector 128 converts the modulated beam intensity $\Delta P$ of the phase modulated beam 400 (see FIG. 4 and FIG. 5) into a modulated voltage signal $\Delta V$, which can be viewed on the oscilloscope 120. Typical high speed (>GHz) photodetectors, such as photodetector 128, have conversion gains of the order 1000 V/W. Thus the responsivity of the EO sensor $\alpha = \Delta V/E$ will be of the order of 0.3 mV/(kV/m) or 0.3 µm.

There are numerous advantages to the current sensor design. First, the components of the sensor head 100 are free of metallic materials, and thus do no perturb the external electric field 130 or fields that the sensor is designed to measure. Unlike conventional sensors, which detect only field strength of the external electric field 130, the EO sensor of the exemplary embodiments detects both field strength and phase of the external electric field 130 being measured. That is, the output signal from the sensor will be a precise reproduction of the field applied to the sensor head 100. Secondly, the sensor head 100 in the exemplary embodiments is approximately 3 cm long, which is much smaller than conventional B dot and D dot probes, making it useful for field detection inside a cavity (even in a very small cavity). This enables measurement of fields in a confined microwave cavity or in a cavity where a power cable is placed.

In the first exemplary embodiment, the advantage of utilizing an optical fiber (compared to a free space sensor) is that it eliminates the need for optical alignment between the various optical components and stages. Additionally, the sensor is less sensitive to misalignments due to external vibrations. These features allow the sensor head 100 to be moved through the external electric field 130 applied (e.g., during spatial field mapping applications), without the need of constantly realigning the optics.

In preferred exemplary embodiments, maintaining the integrity and coherence of the beam polarization is of critical importance, because the sensor detects very small changes in polarization. The passage of the probe beam through the optical fibers, the first and second GRIN lenses and the U benches presents vulnerabilities to the coherence of polarization and losses in responsivity. In preferred exemplary embodiments, the optical components of the invention were carefully chosen to minimize such losses.

In the first exemplary embodiment, the use of optical fiber allows for remote detection of an external field. As shown in FIG. 1, the sensor head 100 can simply be placed into the external electric field 130 region, while the beam analysis/analyses and signal processing electronics can occur remotely from the external electric field 130 (connected by optical fiber), thus, avoiding any possible exposure to the external electric field 130 or electrical interference.

Referring again to FIG. 1, in the first exemplary embodiment, the quarter wave plate 124 utilized in the fiber U bench 122 produces two additional advantages. Firstly, when properly configured with PM fiber 112B (as specified by the design parameters of the exemplary embodiments, the utilization of the quarter wave plate 124 allows the maximum sensor responsivity (as described by Equation (1)) to be obtained regardless of the polarization state $\phi_0$ of the laser probe beam 132. By contrast, in traditional crossed polarizer configurations of electro optic sensors, the peak modulation amplitude will generally be equal or less than that described by Equation (3), depending on the polarization state $\phi_0$. Thus the quarter wave plate 124 improves the sensor responsivity and stability over the traditional (crossed polarizer type) configuration by eliminating drifts in peak responsivity caused by changes in the birefringence of the EO crystal 102. Secondly, the utilization of the quarter wave plate 124 in the fiber U bench 122 allows the sensor to be passively calibrated by monitoring the transmitted beam power (photodiode current) in the photodetector 128. Thus, in exemplary embodiments, the sensor can be set to its most sensitive state and prepared for detection, prior to being placed in the external electric field 130.

Further, in the first exemplary embodiment, the electro optic field sensor is configured for use in high power microwave (HPM) test and evaluation environments. Therefore, due to advantages and new features, the electro optic field sensor can be used for many other purposes, including the diagnosis of radar and microwave devices, characterization of lightening and diagnosis of power lines.

Figure 2:
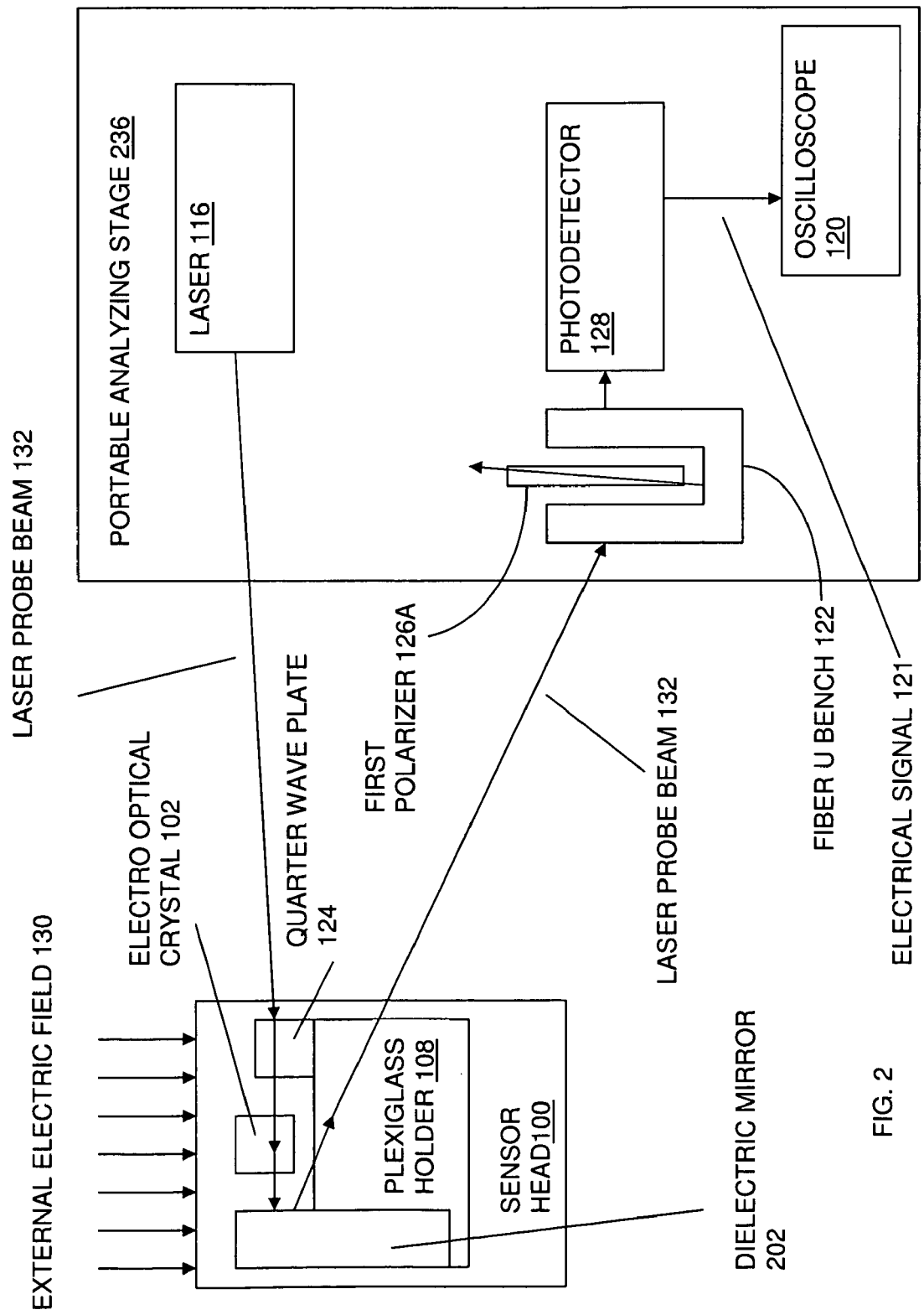
FIG. 2 illustrates an optical electro magnetic field apparatus for measuring an applied electric field using a sensor head, an analyzing stage and a free space laser probe beam communicatively coupling the sensor head to the analyzing stage.

In a second exemplary embodiment, referring to FIG. 2, additional features of the sensor head 100 and a portable analyzing stage 236 are schematically illustrated, where the sensor head 100 is placed in the external electric field 130 that is to be detected. A laser probe beam 132 is transmitted from the portable analyzing stage 236 to the sensor head 100 through free space. The laser probe beam 132 is reflected back to the portable analyzing stage 236 by a dielectric mirror 202 within the sensor head 100. Upon reaching the analyzer stage, the laser probe beam 132 is analyzed as it passes through a free space polarizer (such as the first polarizer 126A). The analyzed laser probe beam 132 is then sent to a photodetector (such as the photodetecter 128) which converts the optical signal (such as the intensity modulated optical output 410) into an electrical signal (such as the electrical signal 121) which is displayed on oscilloscope 120, or may be displayed on a spectrum analyzer or any other readout instrument capable of measuring fast electrical signals. The resulting amplitude of the electrical signal 121 will be proportional to the amplitude of the external electric field 130. The resulting phase of the electrical signal 121 will be precisely reproduced from and identical to the phase of the external electric field 130. Thus, for any time varying electric field E(t), such as the external electric field 130, the electrical signal 121 output from the sensor will be $\alpha E(t)$, where $\alpha$ is a constant, depending on the power of the laser 116, conversion gain of the photodetector 128, and properties of the EO crystal 102. The quantity $\alpha$ is called the responsivity of the EO field sensor. The first polarizer 126A, mounted in front of the photodetector 128 is used to calibrate and optimize the responsivity of the sensor.

Figure 3:
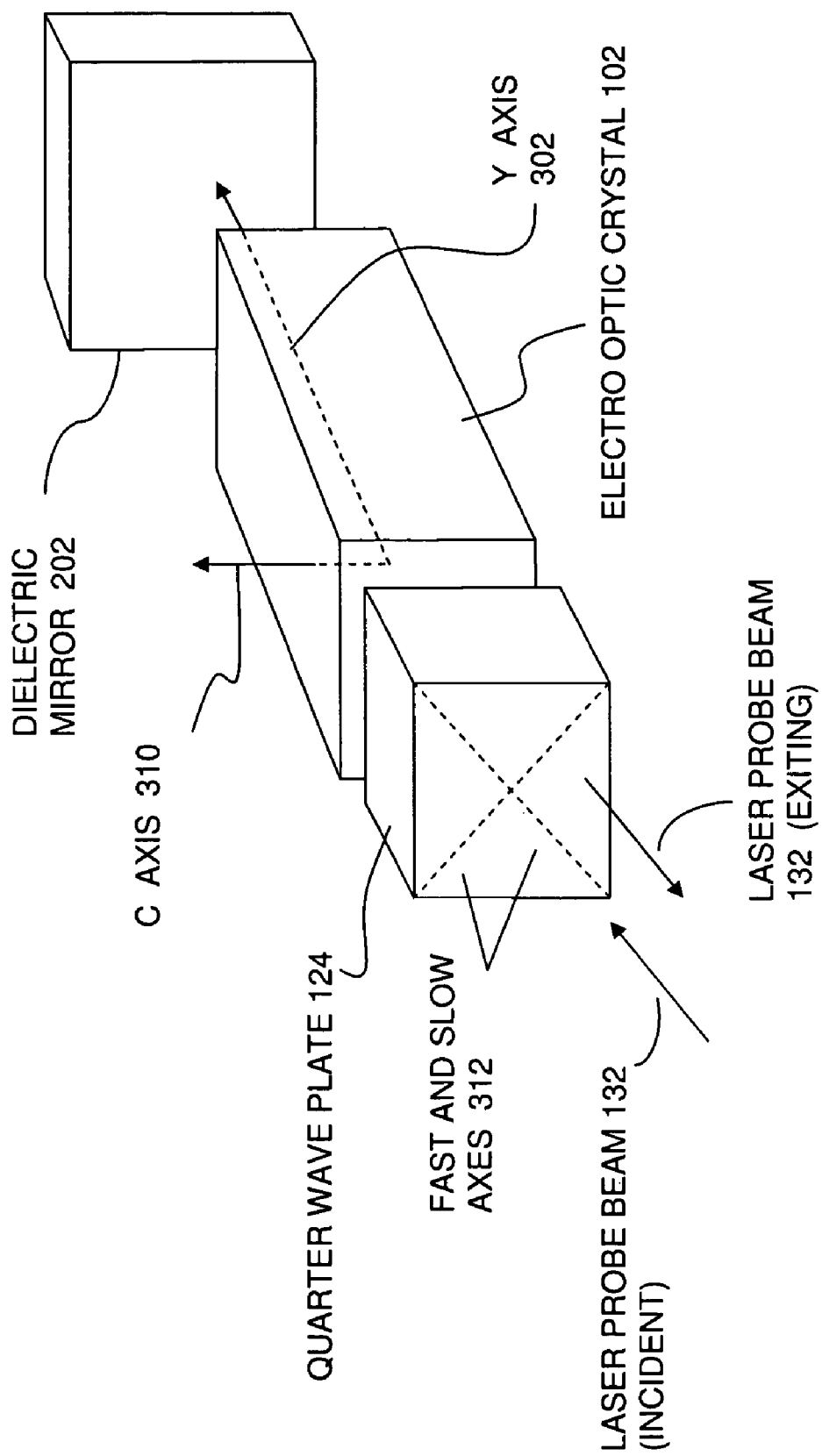
FIG. 3 illustrates an exploded view of the sensor head portion of the optical electro magnetic field apparatus shown in FIG. 2

An exploded view of the components of the sensor head 100 is shown in FIG. 3, where the sensor head 100 consists of a quarter wave plate 124, the EO crystal 102 and the dielectric minor 202, all of which are mounted in a plexiglass sample holder (not shown), such as the plexiglass holder 108. The total length of the sensor head 100 (including the plexiglass holder 108) is approximately 3 cm.

Again referring to FIG. 3, the quarter wave plate 124 is zero order, and oriented with its fast/slow axes 312 at 45 degree angles with respect to the c axis 310 (i.e., optic axis) of the EO crystal 102. The laser probe beam 132, incident to the quarter wave plate 124, is linearly polarized at 45 degrees with respect to the c axis 310 of the EO crystal 102 (i.e., parallel to either the fast or slow axis of the fast/slow axes 312, of the quarter wave plate 124) and the laser probe beam 132, incident to the quarter wave plate 124, propagates parallel to the y axis 302 of the EO crystal 102. The function of the EO crystal 102 is to modulate polarization of the laser probe beam 132. Further, the c axis 310 is perpendicular to the y axis 302.

In the exemplary embodiments, the material composing the EO crystal 102 can be Lithium Niobate, or any other EO material with sufficient EO modulating power. In the absence of an external electric field 130 applied, the natural birefringence of the EO crystal 102 converts the polarization state ($\phi$) of the laser probe beam 132 from linearly polarized ($\phi=0$) to elliptically polarized ($\phi=\phi_0$). When the sensor head 100 is placed in the external electric field 130, a small shift occurs in this elliptical polarization state ($\phi=\phi_0+\delta\phi$), which is eventually converted to the electrical signal 121 at the analyzer stage downstream. The function of the dielectric mirror 202 is to increase the modulating power of the sensor head 100 by doubling the optical path-length L of the laser probe beam 132 within the EO crystal 102.

In accordance with the second exemplary embodiment, the components of the analyzing stage are shown in FIG. 2. The laser 116 utilized for the EO field sensor can range from between about 1 to 20 mW or more in power and between about 530 nm to 1550 nm in wavelength. The laser probe beam 132 (reflected from the dielectric minor 202 and returning to the portable analyzing stage 236) passes through an analyzer (i.e., referred to herein as the first polarizer 126A) before being received by the photodetector 128. The analyzer (i.e., the first polarizer 126A) converts the shift in the laser probe beam 132 polarization (created by the external electric field 130) into a modulation of beam intensity $\Delta P$. The sensor is actively calibrated by rotating the first polarizer 126A (manually or though an automated rotation stage, such as the motorized rotation stage 544) until the amplitude of the electrical signal 121 output from the photodetector 128 is maximized. Because of the unique design of the sensor, the rotational position of the analyzer (such as the first polarizer 126A) that achieves maximum signal amplitude will always coincide with the position in which the midpoint of the total beam power (one half of the maximum value plus one half of the minimum value, hereafter designated as the "half transmittance point") is transmitted through the first polarizer 126A to the photodetector 128, regardless of the polarization state $\phi_0$ of the laser probe beam 132. Since most commercial photodetectors have current monitors for measuring the beam power received by the photodiode, an alternative method to calibrate the sensor is to simply rotate the first polarizer 126A until the half transmittance point (as measured by the photodiode current monitor of the photodetector 128) is reached. In contrast to active calibration, which requires the sensor head 100 be placed in the external electric field 130 applied for measurement, this latter method of passive calibration can be performed in the absence of the external electric field 130. As the birefringence of the EO crystal 102 drifts, the polarization state $\phi_0$ of the laser probe beam 132 will be changed along with the transmitted beam power reaching the photodetector 128. When this occurs, the calibration of the EO sensor must be restored by adjusting the first analyzer 126A until one half of the total beam power is once again transmitted to the photodetector 128. To avoid the cumbersome task of continuous manual adjustments of the analyzer (i.e., manual adjustments of the first polarizer 126A), an automated rotation stage can be used to constantly adjust the analyzer (such as the first polarizer 126A) to the half transmittance point, ensuring that the calibration of the EO sensor is sustained automatically.

When the EO sensor is calibrated (half transmittance point attained by adjustment of first polarizer 126A) the modulation $\Delta P$ is at its peak value, given by:

$$\Delta P = P_0 \frac{\pi L n^3 r_{33}}{3\lambda} E, \tag{2}$$

Where $P_0$ is the beam power of the laser probe beam 132 passing through the EO crystal 102, L is the total optical path length of the laser probe beam 132 within the EO crystal 102, n is the refractive index of the EO crystal 102, $r_{33}$ is the electro optic coefficient of the EO crystal 102, $\lambda$ is the wavelength of the laser 116, and E is the value of external electric field 130 applied. For $P_0=0.5$ mW, L=40 mm, n=2.2, $r_{33}=20$ pm/V, $\lambda=633$ nm (typical operating parameters), the modulation per unit of the external electric field 130, $\Delta F/E$ evaluates to be approximately 1 µW/kV/m. The peak modulation described by Equation (1) reflects the maximum modulating power of the sensor head 100, and is independent of the polarization state $\phi_0$ of the laser probe beam 132 exiting the crystal. The significance of this result is that $\Delta P$ in Equation (1) is not affected by drifts and fluctuations of birefringence in the EO crystal 102. Thus the modulation signal will be stable and maximized, as long as, the calibration of the EO sensor is sustained. The validity of Equation (1) is contingent on the use of the quarter wave plate 124 and the alignment of its fast/slow axes with respect to the optic axis (i.e., the C axis 310) of the EO crystal 102, as specified by the design of the exemplary embodiments. Thus the design parameters of the exemplary embodiments are critical in the eliminating the problem of signal fluctuations associated with variations of birefringence in EO sensors.

Figure 4:
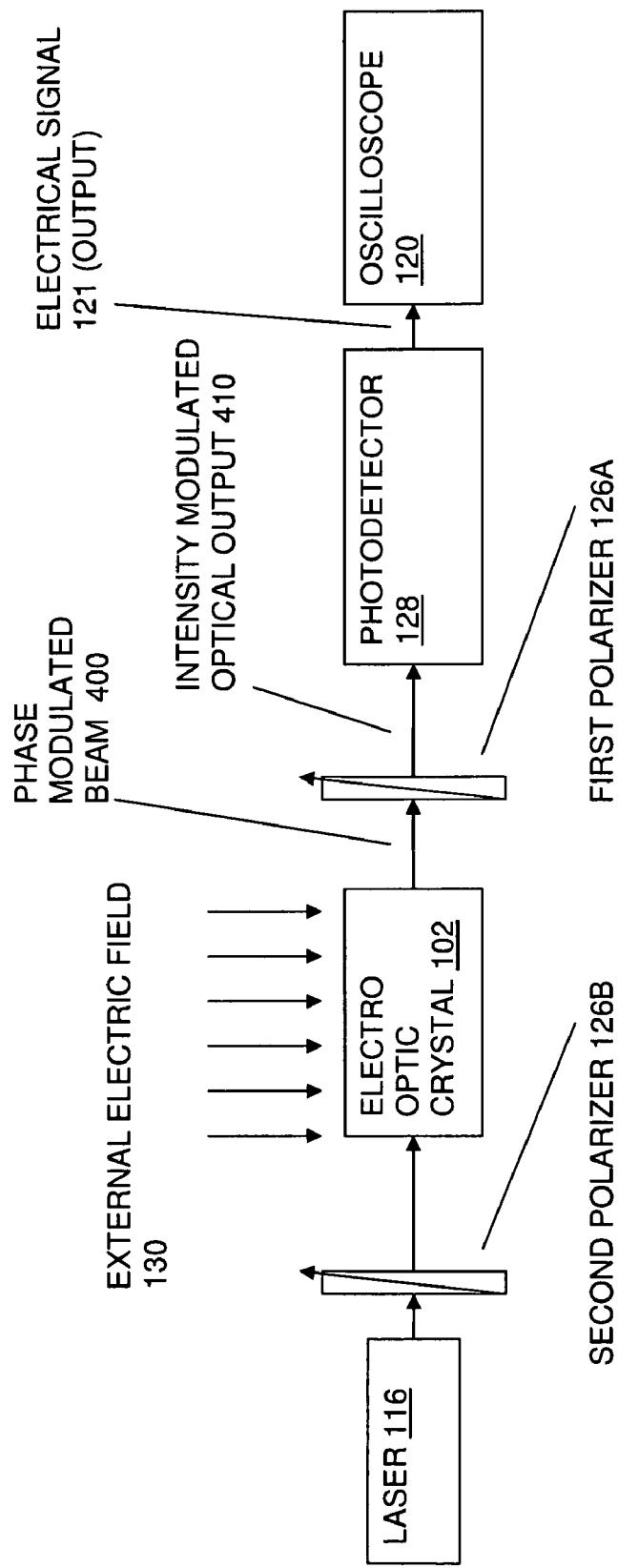
FIG. 4 illustrates a general optical modulation application according to the exemplary embodiments of the optical electro magnetic field devices for measuring an applied electric field, discussed herein.
Figure 5:
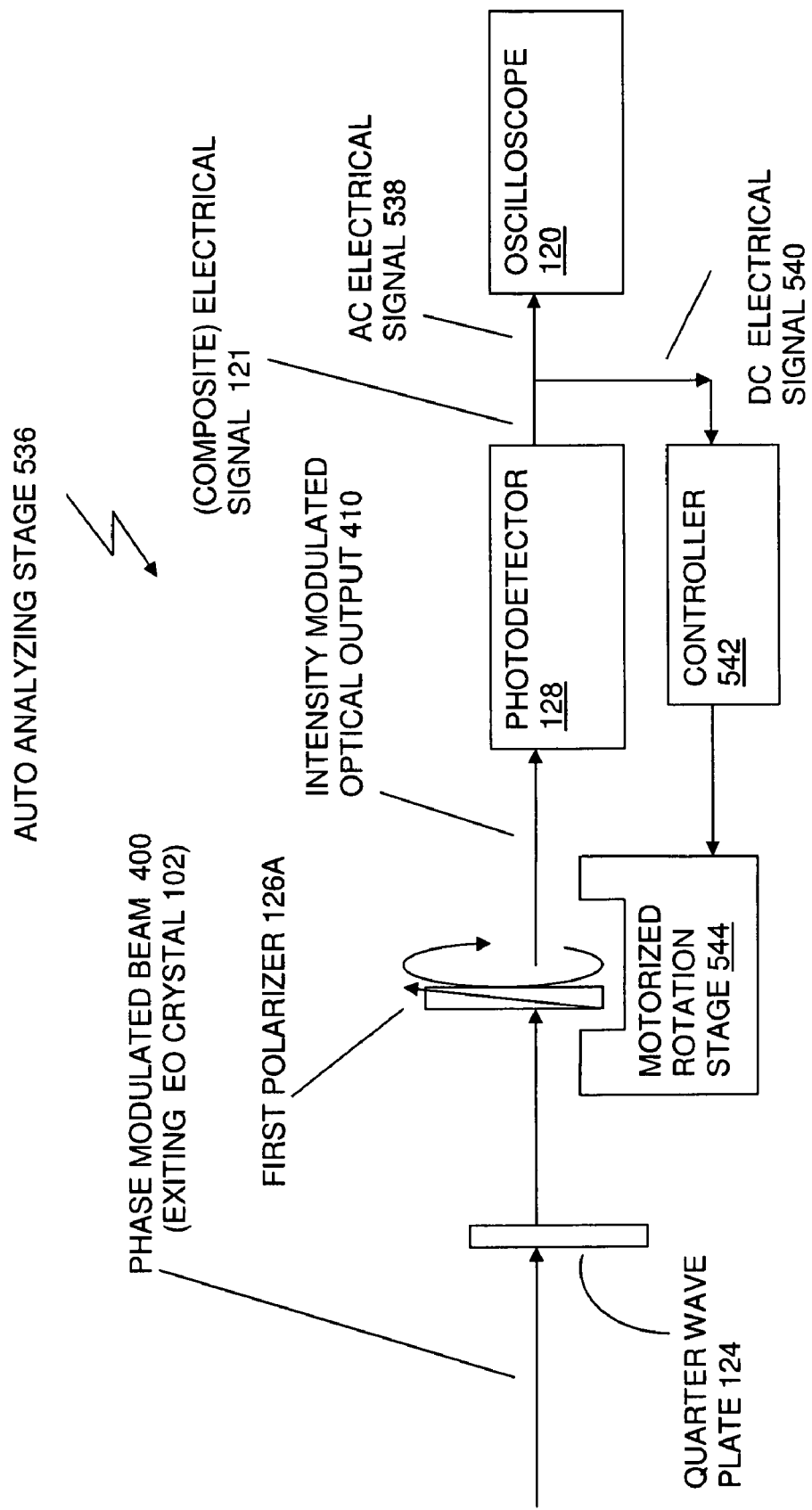
FIG. 5 illustrates a system configuration of an auto analyzing stage of an electro magnetic field measuring system.

Referring to FIG. 2, FIG. 4 and FIG. 5, the photodetector 128 converts the modulated beam intensity $\Delta P$ of the phase modulated beam 400 into a modulated voltage signal $\Delta V$, which can be viewed on the oscilloscope 120. Typical high speed (>GHz) photodetectors, such as photodetector 128, have conversion gains of the order 1000 V/W. Thus, the responsivity of the sensor head 100 EO sensor $\alpha = \Delta V/E$ will be of the order of 1 mV/(kV/m) or 1 μm.

There are numerous advantages to the current sensor design. A key distinguishing feature of the exemplary embodiments over conventional (D dot) field sensors is that the components of the sensor head 100 are free of metallic materials, and thus do not perturb the very fields, such as the external electric field 130, which is being measured. Conventional field sensors interrupt the external electric field 130, and therefore yield unreliable results. In the exemplary embodiments, unlike conventional sensors, which detect only field strength, the sensor head 100 detects both field strength and phase. That is, the electrical signal 121 (output) from the sensor will be a precise reproduction of the external electric field 130 applied to the sensor head 100. Also, in the exemplary embodiments, the sensor head 100 is capable of detecting an external electric field 130 over an ultra broadband range, namely in the order of from DC to 10 GHz. The bandwidth of conventional field sensors is typically a few percent of their operating frequencies, and therefore the bandwidth of conventional field sensors is much poorer than that of the EO sensors of the exemplary embodiments disclosed herein. In addition to the above mentioned advantages, the sensor head 100 of the exemplary embodiments is much smaller than the conventional B dot and D dot probes, making the sensor described in the exemplary embodiments useful for detailed field detection even in small confined areas. By reflecting the laser probe beam 132 back through the crystal, the sensitivity is doubled (through the added optical path length), without increasing the size of the sensor head 100.

The reflection mode design also allows for remote detection of an external electric field, such as the external electric field 130. Referring to FIG. 4, the laser probe beam 132 can simply be directed into the external electric field 130 region, reflected back, and proceeds to extract the field. Thus the signal processing electronics can be located remotely from the external electric field 130, avoiding any possible exposure to the external electric field 130 or electrical interference.

Referring to FIG. 2 and FIG. 3, the quarter wave plate 124 integrated into the sensor head 100 produces two additional advantages. First, it allows the maximum sensor responsivity (as described by Equation (1)) to be obtained regardless of the polarization state $\phi_0$ of the laser probe beam 132. By contrast, in traditional crossed polarizer configurations of electro optic sensors, the peak modulation amplitude will generally be equal or less than that described by Equation (3), depending on the polarization state $\phi_0$. Thus the quarter wave plate 124 improves the sensor responsivity and stability over the traditional (crossed polarizer type) configuration by eliminating drifts in peak responsivity caused by changes in the birefringence of the EO crystal 102. Secondly, the utilization of the quarter wave plate 124 in the fiber U bench 122 allows the sensor to be passively calibrated by monitoring the transmitted beam power (photodiode current) in the photodetector 128. Thus, in exemplary embodiments, the sensor can be set to its most sensitive state and prepared for detection, prior to being placed in the external electric field 130.

The purpose behind the developments of the exemplary embodiments is to analyze a phase modulated laser probe beam, such as the laser probe beam 132, from optically modulating devices such as EO modulators and EO field sensors, while stabilizing and maximizing both the amplitude and phase of output optical signals.

FIG. 4 illustrates a general optical modulation application of the exemplary embodiments, including the laser 116, a second polarizer 126B, the EO crystal 102, the first polarizer 126A, the photodetector 128 and the oscilloscope 120. In some configurations, such as that illustrated in FIG. 4, the quarter wave plate 124 is not used to analyze the laser probe beam 132. The external electric field 130 applied to the EO crystal 102 or EO polymers produces a change in the birefringence of material comprising the EO crystal 102 (i.e., exhibiting an electro optic effect). The laser probe beam 132 passing through the EO polymer material senses these modulations through changes in the phase, or equivalently a change in polarization state, of the laser probe beam 132. The laser probe beam 132 then passes through an analyzer (i.e., the first polarizer 126A), whose transmission axis is typically set at a 45 degree angle with respect to the c axis 310 of the EO crystal 102. The analyzer (i.e., first polarizer 126A) converts the laser probe beam 132, which has been phase modulated, to an intensity modulated optical output 410 (typically sent to a photodetector 128 or to another optical circuit).

The amplitude of the optical output signal will be proportional to the amplitude of the external electric field 130 applied to the EO crystal 102 or EO polymer. The proportionality factor is defined as the EO responsivity. For EO field sensor applications, the optical output signal will be used to determine the strength and phase of an external electric field, such as the external electric field 130. In optical modulator applications, the external electric field 130 applied will be used to drive and control the optical output signal.

In applications such as those that the exemplary embodiments are directed to, it is often a desired goal to maximize the EO responsivity. However, in the configuration shown in FIG. 4, the EO responsivity is proportional to a phase factor, $\sin \phi_0$. In the exemplary embodiments, $\phi_0$ is a quantity which depends on the optical path length of the laser probe beam 132 within the EO crystal 102, the natural birefringence of the EO crystal 102, and the wavelength of the laser probe beam 132. The phase factor is strongly influenced by very small changes in the optical path length (less than one wavelength of the laser probe beam 132) as well as nonlinear optical effects such as photorefractivity (optically induced birefringence), pyroelectricity (thermally induced birefringence), and photoelasticity (strain induced birefringence). Because of these internal effects, the phase factor can vary uncontrollably between −1 and +1. This is generally an undesirable effect since the EO responsivity becomes an unpredictable quantity. Referring to FIG. 5, a third exemplary embodiment describes a technique of maintaining the phase factor at a value +1; thus, simultaneously optimizing and stabilizing the EO responsivity.

In accordance with a third exemplary embodiment, FIG. 5 represents configuration changes of the EO sensor over the configuration of the EO sensor illustrated in FIG. 4. The analyzer (i.e., the first polarizer 126A) coupled to the photodetector 128 in FIG. 4 is replaced in FIG. 5 with the first polarizer 126A that is automatically rotatable by the addition of a motorized rotation stage 544, shown schematically in FIG. 5, as including the following elements: the motorized rotation stage 544, a computer controller, such as a controller 542, communicatively attached to and driving the motorized rotation stage 544, based on the DC component (i.e., DC electrical signal 540) of the electrical signal 121. Referring again to FIG. 5, a quarter wave retardation plate, such as the quarter wave plate 124 is placed between the EO crystal 102 and the analyzer (i.e., the first polarizer 126A), where the first polarizer 126A is communicatively connected optically, i.e., using optical devices and leads to the photodetector 128), and where the fast and slow, i.e., fast/slow axes 312 of the quarter wave plate 124 are set at 45 degree angles with respect to the c axis 310 of the EO crystal 102 (see FIG. 3). With a quarter retardation wave plate, such as the quarter wave plate 124 in this orientation, the phase factor in the responsivity changes from $\sin \phi_0$ to $\cos(\phi_0+2\theta_p)$. Here, $\theta_p$ is the rotation angle of the analyzer (i.e., the first polarizer 126A) with respect to the c axis 310 of the EO crystal 102 (see FIG. 3). Since $\phi_p$ has a range of 360 degrees, the phase factor can be adjusted to be +1 for any arbitrary value of $\phi_0$. However, since $\phi_0$ is constantly changing (due to optical instabilities), the analyzer/polarizer angle which produces a phase factor of +1 will likewise vary, based on the optical instabilities. The fact that the phase factor can be adjusted to be +1 for any arbitrary value of $\phi_0$ is the basis for how signal fluctuations occurring in EO field sensors are stabilized.

In exemplary embodiments, the physics of the optical circuit is such that the value of $\theta_p$ which maximizes the phase factor can be inferred from the beam intensity I transmitted through the analyzer (i.e., the first polarizer 126A). This intensity is measured through the dc level of the modulation signal, or through a photodiode current monitor (common in many photodetectors, such as the photodetector 128). As the analyzer (i.e., the first polarizer 126A) is rotated, by the motorized rotation stage 544, through its full 360 degree range, I will undergo maximum and minimum values ($I_{max}$, $I_{min}$). The value of $\theta_p$ which produces a phase factor of ±1 will always occur (i.e., for any arbitrary value of $\theta_0$) when the transmitted beam intensity is one half of its maximum plus minimum values i.e., when $I=(I_{max}+I_{min})/2$. A phase factor of +1 generally occurs when the derivative $dI/d\theta_p>0$, while a phase factor of −1 generally occurs when the derivative $dI/d\theta_p<0$.

Again referring to FIG. 5, in the third exemplary embodiment, a feedback algorithm is utilized in conjunction with the controller 542 having a memory containing a program unit including a computer readable and computer executable medium where a computer readable and computer executable program code resides. When the program code is executed by the controller 542, the executable program code causes the controller 542 to measure I (from either the photodiode current monitor or a dc signal level of electrical output, such as the DC electrical signal 540) as a function of the rotation angle ($\theta_p$) of the first polarizer 126A, which is communicatively connected to the photodetector 128, as illustrated in FIG. 5. The controller 542 measures I from either an internal voltmeter, or directly from the oscilloscope 120. Based on these measurements, the controller 542 sends a signal, to the motorized rotation stage 544, which rotates the first polarizer 126A to sustain the targeted level of beam intensity i.e., $(I_{max}+I_{min})/2$, with $dI/d\theta_p>0$. Changes or drifts in $\phi_0$ are observed as changes in I, which can be automatically corrected by small changes in the analyzer angle, (i.e., small changes in the angle of the first polarizer 126A). Since $I_{max}$ and $I_{min}$ do not change with $\phi_0$, only a single initial measurement of $I_{max}$ and $I_{min}$ is necessary for sustained operation of the auto analyzing stage 536.

In the exemplary embodiments, the EO crystal 102 is birefringent. Therefore, the laser probe beam 132 passing through the EO crystal 102 will acquire a phase shift $\phi$. The phase shift acquired by the laser probe beam 132 determines the polarization state of the laser probe beam 132 (i.e., either linear, circular, or elliptical polarization state). When the external electric field 130 E (input) is applied to the EO crystal 102, the phase shift is given as $\phi=\phi_0+\phi_{EO}$, where $\phi_0$ is the phase shift of the laser probe beam 132 with external electric field 130 is absent (, i.e., where the external electric field 130 is zero due to the natural birefringence of the EO crystal 102), $\phi_{EO}$ is the additional or "modulated" phase shift produced by the external electric field 130 applied to the sensor head 100. Generally, $\phi_{EO}$ is proportional to the external electric field 130 applied to the sensor head 100 (this is the linear electro optic effect).

In the exemplary embodiments, the optical circuit shown in FIG. 4 is designed to convert the phase modulation ($\phi_{EO}$) to a modulation of beam intensity. Referring to FIG. 5 and FIG. 4, after passing through the quarter wave plate 124 (see FIG. 5), and the analyzer (i.e., the first polarizer 126A), the transmitted beam intensity p reaching the photodetector 128 will be of the form $p=p_0+m$, where $p_0$ is the transmitted intensity when the external electric field 130 applied is zero (i.e., absent the external electric field 130), and m is the intensity modulation produced by the incident external electric field applied to the sensor head 100. In the exemplary embodiments, m is proportional to $\sin \phi_{EO}$. However in most EO sensor applications, $\sin \phi_{EO} \sim \phi_{EO}$, i.e., the modulation is expressed as $m=\alpha E$ (since $\phi_{EO}$ is proportional to E). The quantity $\alpha$ is a constant and is defined as the EO responsivity. Thus by measuring the modulated component of the electrical output signal, such as the electrical signal 121 (output), the input field E can be determined.

In exemplary embodiments, a common difficulty in polarimetric detection technique is that $\alpha$ is an unstable quantity, causing drifts in the amplitude of the sensor output signal when the amplitude of the external electric field 130 input to the sensor head 100 is constant. The drifts are actually produced by variations in the polarization state of the laser probe beam 132 exiting the crystal. These variations are caused by changes in ambient temperature, photorefractive effects, screening charges, and other factors. These mechanisms can cause the polarization state to vary dramatically, between elliptical, circular and linear states. This in turn, will cause the value of $\alpha$ to vary in both magnitude and sign. Under laboratory evaluation conditions, the time scale in which noticeable responsivity fluctuations occur is typically several per tens of minutes.

From a theoretical basis, the sensitivity to the polarization state arises because of the dependence of m on $\phi_0$. This can be seen explicitly by solving for m in the configuration shown in FIG. 4. In normalized units, $\underline{m}$ is solved for by:

$$m=\sin \phi_{EO}[c_1 \cos \phi_0 - c_2 \sin \phi_0] \qquad (3)$$

where $$c_1=-\sin 2(\theta_p-\theta_\lambda)\sin \phi_\lambda$$

$$c_2=\sin 2\theta_\lambda \cos 2(\theta_p-\theta_\lambda)+\sin 2(\theta_p-\theta_\lambda)\cos \phi_\lambda \cos 2\theta_\lambda, \qquad (4)$$

$\phi_\lambda$ is the phase retardation of the quarter wave plate 124, $\theta_\lambda$ is the rotation angle of the quarter wave plate 124, and $\theta_p$ is the rotation angle of the analyzer (i.e., $\theta_p$ is the rotation angle of the first polarizer 126A). The bracketed quantity in Equation three (3) is the term which is affected by the polarization drifts, and shall be defined here as the "phase factor" of the responsivity.

Because of the dependence of m on $\phi_0$, the drifts in polarization complicate the operation of the sensor. In most cases, a separate measurement of the phase shift $\phi_0$ would be required to determine the phase factor and correctly measure E, the external electric field 130. The fluctuations in the phase factor could be stabilized to a certain degree by constantly adjusting, manually, the wave plate angle ($\theta_2$) and the analyzer angle ($\theta_P$) in response to the polarization drifts. However in certain cases, this is impossible. An example of this is the case where neither the quarter wave plate 124 nor a half wave retardation plate is used in FIG. 1 (i.e., $\phi_\lambda=0, \pi, 2\pi$, etc.). In this configuration, when the laser probe beam 132 exiting the EO crystal 102 reaches a linearly polarized state ($\phi_0=0$), the phase factor in Equation (3) will be zero regardless of $\theta_2$ and $\theta_P$. In such a situation, zero modulation will be produced by the EO sensor.

Referring to FIG. 5, in accordance with the third exemplary embodiment, there is a unique configuration of optical components which allows a phase factor of +1 to be attained for any polarization state of the laser probe beam 132 (exiting). This is the basis of the auto analyzing stage 536, as illustrated in FIG. 5. Furthermore, a separate measurement of the phase shift $\phi_0$ is not needed in this configuration. This configuration consists of a quarter wave retardation plate, such as the quarter wave plate 124 ($\phi_2=\pi/2$ in FIG. 3) (also see FIG. 1 and FIG. 5) held at a fixed angle ($\theta_\lambda$) of 45 degrees with respect to the c axis 310 of the EO crystal 102 (see FIG. 3). In this unique configuration, the equations for m and $p_0$ simplify to:

$$m = \sin\phi_{EO}[\cos(2\theta_p + \phi_0)], \quad (5)$$
$$p_0 = \frac{1}{2}[1 + \sin(2\theta_p + \phi_0)].$$

It can be seen in Equation five (5) that a phase factor of 1 can be attained for any coherent polarization state (i.e., any value of $\phi_0$) by simply rotating the analyzer (i.e., by simply rotating the first 126A) such that $\cos(2\theta_P+\phi_0)=1$. When this condition is achieved, then $p_0=\frac{1}{2}$. Therefore, the transmitted power is at one half of the total intensity. Thus, by only monitoring the dc level signal emitted from the photodetector 128, i.e., the DC electrical signal 540, (e.g., via a photodiode current monitor), the sensor, i.e., the auto analyzing stage 536, can be set and maintained at its most sensitive operating point (phase factor =1). The auto analyzer as configured in the auto analyzing stage 536, as illustrated in FIG. 5, performs this very task. In the case of the fiber optic sensor illustrated by FIG. 1, The equations for m and $p_0$ are of greater complexity than shown in Equation (5). Nevertheless, the identical result (phase factor of +1 occurring at half transmittance point, for any value of $\phi_0$) is obtained provided that: (1) either the fast axis or slow axis of the second polarization maintaining fiber 112B is aligned with (i.e., parallel to) the c-axis 310 of the EO crystal 102, and (2) the quarter wave plate 124 is oriented with its fast and/or slow (fast/slow) axes at 45 degree angles with respect to the fast and/or slow (fast/slow) axes of the second PM fiber 112B.

The photodetector 128 converts the transmitted beam intensity into an electrical signal, such as the electrical signal 121. The electrical signal 121 will consist of a dc or zero field component, and a field modulated ac component (i.e., the DC electrical signal 540 and the AC electrical signal 538, respectively). The dc component, i.e., the DC electrical signal 540 level, is essentially a measure of the beam power, $p_0$. This dc component (i.e., the DC electrical signal 540) is read and monitored by a voltmeter. The voltmeter is read by a computer processor residing in a controller 542, and which instructs the controller 542 to rotate the analyzer (i.e., the first to rotate the first polarizer 126A) based on these readings.

When initiated, the auto analyzer (i.e., the first polarizer 126A, now automated) undergoes a full 360 degree rotation, to find the maximum and minimum values of $p_0$, denoted as $p_{MAX}$ and $p_{MIN}$ respectively. For a coherently polarized laser beam of light, such as the laser probe beam 132, Equation (5) predicts that $p_{MAX}=p_0$ and $p_{MIN}=0$. However in real crystals, these measurements can be affected by incoherently polarized light within the laser probe beam 132 (observed as a constant dc background or dc signal level in the photodetector 128). To account for such offsets, the targeted value of $p_0$ for optimal sensor operation is set at $(P_{MAX}+p_{MIN})/2$. In the third exemplary embodiment, the operation set point must satisfy $(dp_0/d\theta_p)>0$. The latter condition $(dp_0/d\theta_p>0)$ is necessary to ensure a phase factor of +1, rather than –1 is attained. In the third exemplary embodiment, the Auto Analyzer (i.e., the first polarizer 126A) is then programmed to find and maintain this transmission set point. As the polarization state of the laser probe beam 132 drifts, a change in the transmitted power $p_0$ will be detected, and the Auto Analyzer (i.e., the first polarizer 126A) is instructed to rotate and adjust itself, by-way-of the motorized rotation stage 544, until the targeted transmitted point is again achieved.

Referring to FIG. 4 and FIG. 5), in the third exemplary embodiment, there are several advantages of the invention over conventional and/or traditional polarizers. First, the configurations and operations of the third exemplary embodiment simultaneously stabilize and maximize the amplitude of intensity modulated light signals, such as intensity modulated optical output 410 (see FIG. 4 and FIG. 5), from EO modulating devices. The use of conventional and/or traditional polarizers can improve the stability to a certain degree, but cannot overcome signal amplitude losses due to changes in the phase factor of the EO responsivity.

Second, the first polarizer 126A, automated, in the third exemplary embodiment allows for hands free operation of the modulating device. That is, the first polarizer 126A automated in the third exemplary embodiment eliminates the cumbersome task of constant manual adjustment of the analyzer (i.e., eliminates the cumbersome task of constant manual adjustment of the first polarizer 126A) to seek the optimal response.

Third, the optimal analyzer (i.e., the first polarizer 126A (optimal)) position is achieved passively, by monitoring the transmitted beam intensity. This feature is particularly useful in EO field sensing applications, since the sensor can be placed in its "ready" state prior to the application of the external electric field 130.

Example 1

Figure 6:
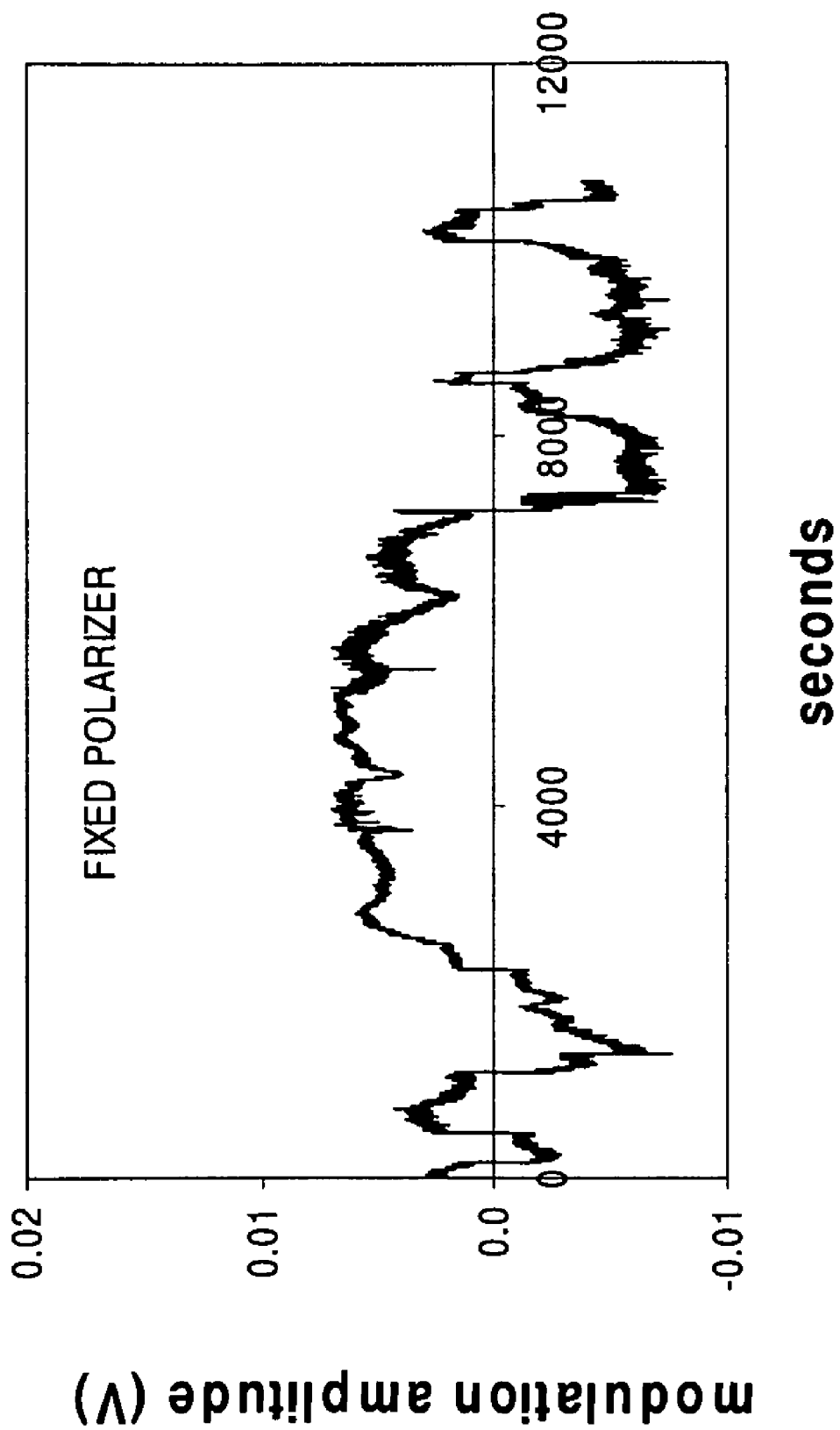
FIG. 6 illustrates a varying, unstable modulation pulse height, plotted as a function of time, from electro optic field sensors, using a fixed polarizer without using an auto analyzer.
Figure 7:
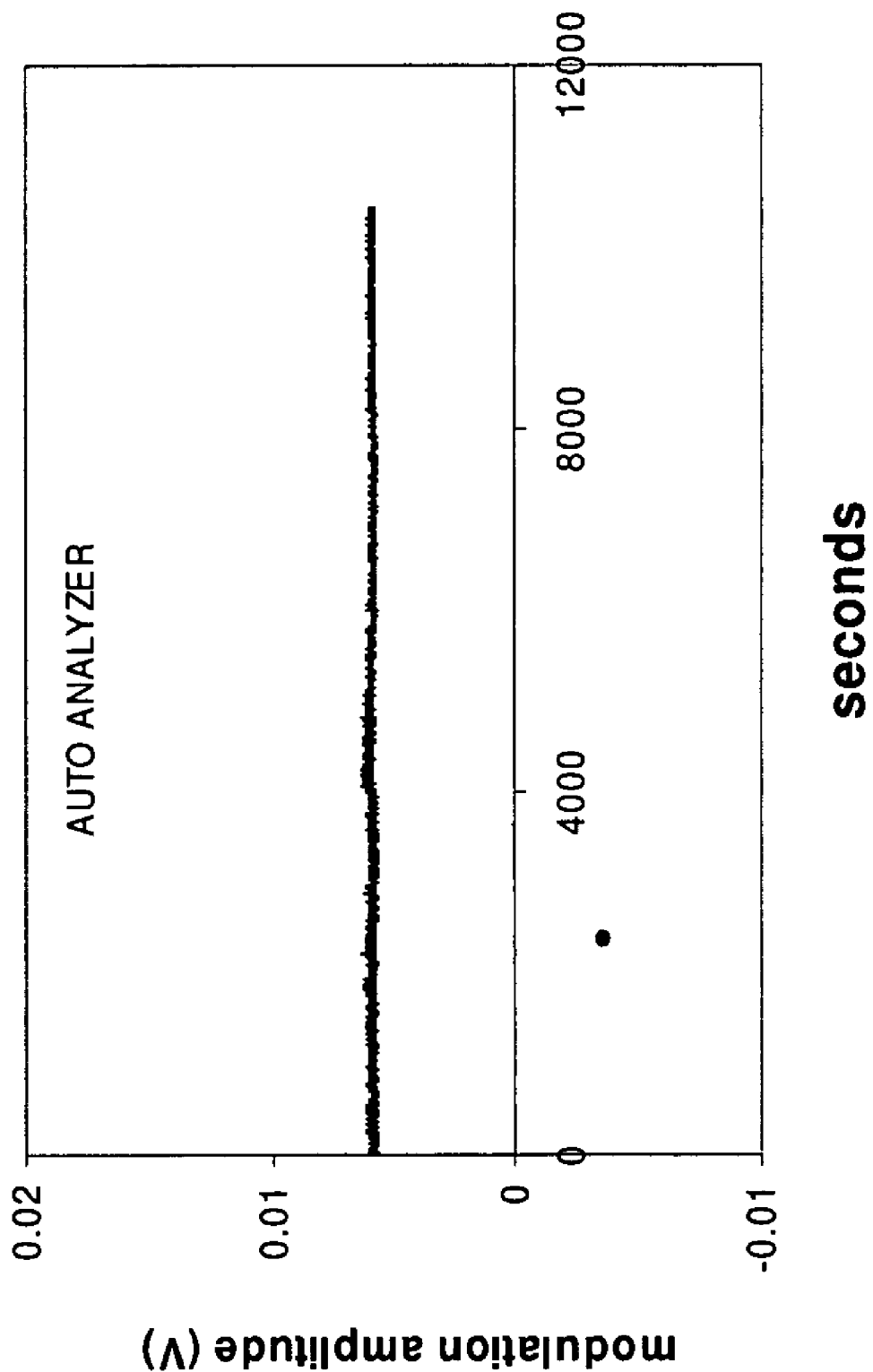
FIG. 7 illustrates a stable modulation pulse height, plotted as a function of time, from electro optic field sensors, using an auto analyzer in place of the fixed polarizer.

FIG. 6 and FIG. 7 illustrate the stability and maximization of modulation amplitude (V) of intensity modulated light signals, such as intensity modulated optical output 410 (see FIG. 4 and FIG. 5), from EO modulating devices. FIG. 6 and FIG. 7 compare the modulation pulse height from an EO field sensor plotted as a function of time. In FIG. 6, a traditional polarizer, such as the first polarizer 126A, (set at a fixed angle which optimized responsivity) was used in the analyzing stage, such as the analyzing stage 136. In FIG. 7, an auto analyzer, i.e., the first polarizer 126A automated in auto analyzing stage 536 (see FIG. 5) was used to analyze the laser probe beam 132. The deviations shown in FIG. 6 represent the deviations in the value of the phase factor $\sin\phi_0$, as previously discussed. As demonstrated by a comparison of FIG. 6 and FIG. 7, the auto analyzer can overcome these deviations and keep the EO sensor stable and operating at its peak responsivity.

While the exemplary embodiments have been particularly shown and described with reference to preferred embodiments thereof, it will be understood by those skilled in the art that the preferred embodiments including the first exemplary embodiment, the second exemplary embodiment and the third exemplary embodiment have been presented by way of example only, and not limitation; furthermore, various changes in form and details can be made therein without departing from the spirit and scope of the invention. Thus, the breadth and scope of the present exemplary embodiments should not be limited by any of the above described preferred exemplary embodiments, but should be defined only in accordance with the following claims and their equivalents. All references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed is:

1. An apparatus for measuring an electric field while minimally perturbing the electric field being measured, the apparatus comprising:

an analyzing stage, including a laser and polarization optics configured to measure the electric field by analyzing a phase modulated laser beam which has passed through an electro optic crystal exposed to the electric field; and a sensor head configured to detect the electric field, wherein the sensor head is optically coupled to the analyzing stage by a first optical fiber lead and a second optical fiber lead, wherein the sensor head includes a plexiglass holder, an electro optic crystal disposed between a first gradient index lens and a second gradient index lens, wherein the electro optic crystal and the first gradient index lens and the second gradient index lens are mounted in the plexiglass holder, wherein the first gradient index lens emits a laser beam transmitted from the analyzing stage to the sensor head that is linearly polarized at a 45 degree angle with respect to an optic axis of the crystal prior to reaching the crystal and propagates along one of an x axis and a y axis of the electro optic crystal, wherein the electric field is applied to the sensor head and upon application of the electric field to the electro optic crystal, the electro optic crystal produces a phase modulation within the laser beam, wherein the second gradient index lens receives the phase modulated laser beam and sends the phase modulated laser beam to the second optical fiber lead, wherein the second optical fiber lead is oriented with one of a fast axis and a slow axis of the second optical fiber lead aligned parallel to the optic axis of the electro optic crystal and the second optical fiber lead transmits the phase modulated beam to the analyzing stage, and wherein the phase modulated laser beam is converted to an electrical signal representing a field strength and a phase of the electric field applied to the sensor head.

2. The apparatus according to claim 1, wherein the laser configured in the analyzing stage includes a power operational range between about 1 milliwatt to 20 milliwatts and has a wavelength operational range of between about 530 nanometers to 1550 nanometers, suitable for high power microwave tests, measurements and evaluations.

3. The apparatus according to claim 1, wherein the analyzing stage further includes a fiber U bench, a quarter wave plate, a polarizer and a photodetector, wherein the quarter wave plate is configured for eliminating drifts in a peak responsivity to the electric field being measured caused by birefringence changes in the electro optic crystal, wherein the quarter wave plate can be configured with a fast axis and a slow axis at 45 degree angles with respect to the fast axis and the slow axis of the second optical fiber lead to increase the peak responsivity of the sensor head to the electric field being measured, and wherein the quarter wave plate and the polarizer are optically coupled and disposed in the fiber U bench.

4. The apparatus according to claim 3, wherein the polarizer is configured for analyzing the phase modulated laser beam and converting a shift in beam polarization into a modulation of beam intensity, wherein the modulation of beam intensity is applied to the photodetector through a third optical fiber lead, and wherein the first optical fiber lead, the second optical fiber lead and the third optical fiber lead maintain optical beam alignment between various optical components and stages.

5. The apparatus according to claim 4, wherein the polarizer is calibrated, by one of an active calibration procedure and a passive calibration procedure, to optimize the modulation of beam intensity, wherein the active calibration procedure includes rotation of a position of an analyzer in the analyzing stage until an amplitude of an output signal from the photodetector is maximized and the electric field is applied to the sensor head, wherein the passive calibration procedure includes rotation of the position of the analyzer, absent the electric field, until a specific quantity of a total beam intensity reaches the photodetector, wherein the specific quantity of the total beam intensity is defined by one half of a maximum beam intensity plus one half of a minimum beam intensity, wherein the maximum beam intensity and the minimum beam intensity are defined as a maximum value and a minimum value of beam power transmitted through the analyzer through a full 360 degree rotation, and wherein the active calibration procedure and the passive calibration procedure are performed one of manually and automatically.

6. The apparatus according to claim 5, wherein the photodetector converts a modulated beam intensity into a modulated voltage to be applied to an oscilloscope.

7. The apparatus according to claim 6, wherein the oscilloscope is configured for measuring and displaying the modulated voltage representing the field strength and the phase of the electric field applied to the sensor head.

8. The apparatus according to claim 7, wherein the sensor head is configured with components made only of dielectric materials to one of reduce and eliminate perturbations of the electric field being detected.

9. An apparatus for measuring an external electric field while minimally perturbing the external electric field being measured, the apparatus comprising:

an analyzing stage, including a laser and polarization optics, a photodetector, and a readout instrument configured therein, wherein the analyzing stage is configured to measure the electric field by analyzing a phase modulated laser beam which has passed through an electro optic crystal exposed to the electric field; and a sensor head configured to detect an amplitude and a phase of the electric field when the electric field is applied to the sensor head, wherein the sensor head includes a plexiglass holder, a wave plate, the electro optic crystal and a dielectric mirror, wherein the electro optic crystal is disposed between the wave plate and the dielectric minor, wherein the wave plate, and the electro optic crystal, and the dielectric minor are mounted in the plexiglass holder, wherein the wave plate is oriented with a fast axis and a slow axis each at a 45 degree angle with respect to an optic axis of the electro optic crystal, wherein the sensor head is optically coupled to the analyzing stage by a laser beam transmitted from the analyzing stage to the sensor head, wherein the laser beam is linearly polarized at a 45 degree angle with respect to the optic axis of the electro optic crystal prior to reaching the electro optic crystal and propagates along one of an x and a y axis of the electro optic crystal, wherein the laser beam is reflected from the dielectric mirror of the sensor head back to the analyzing stage, wherein the laser beam reflected from the dielectric mirror is received by the photodetector configured in the analyzing stage and converted by the photodetector into an electrical signal, wherein a resulting amplitude of the electrical signal is proportional to the amplitude of the external electric field applied to the sensor head and a resulting phase of the electrical signal is identical to the phase of the external electric field applied to the sensor head, and wherein the electrical signal including the resulting amplitude and the resulting phase are displayed and measured on the readout instrument, configured in the analyzing stage.

10. The apparatus according to claim 9, further comprising a polarizer mounted in front of the photodetector, wherein the polarizer is configured by one of actively and passively to calibrate and optimize responsivity of the sensor head, and wherein a sensitivity of the sensor head can be preset to a most sensitive state for detection prior to placing the sensor head in the electric field.

11. The apparatus according to claim 10, wherein the laser beam transmitted from the laser configured in the analyzing stage, by way of the polarizer, undergoes a linear polarization with an angle of forty-five degrees with respect to the optic axis of the electro optic crystal, and wherein the electro optic crystal in the electric field modulates the polarization of the laser beam.

12. The apparatus according to claim 10, wherein the sensor head, including the wave plate, the electro optic crystal, and the dielectric mirror mounted in the plexiglass holder, is configured to have a total length of up to 3 centimeters, wherein the dielectric minor increases a modulating power and increases the sensitivity of the sensor head by doubling an optical path length of the laser within the electro optic crystal, by reflecting the laser beam back through the electro optic crystal and facilitating detecting and measuring of electric fields in remote and confined spaces.

13. The apparatus according to claim 12, wherein the wave plate is one of a zero order wave plate and a higher order wave plate and a quarter wave plate.

14. The apparatus according to claim 9, wherein the laser configured in the analyzing stage has a power range of between about 1 milliwatt to 20 milliwatts.

15. The apparatus according to claim 14, wherein the laser configured in the analyzing stage includes a wavelength operational range of between about 530 nanometers to 1550 nanometers.

16. A system for detecting and measuring an applied electric field, the system comprising:

a sensor head configured to detect an amplitude and a phase of the applied electric field; and an analyzing stage optically coupled to the sensor head by a laser probe beam, wherein the analyzing stage includes a laser configured to transmit the laser probe beam to an electro optic crystal residing in the sensor head and a modulator, wherein the electro optic crystal transforms the laser probe beam into a phase modulated laser probe beam, wherein a gradient index lens transmits the phase modulated laser probe beam to the analyzing stage, wherein the phase modulated laser probe beam is converted to an electrical signal representing the amplitude and the phase of the applied electric field applied to the sensor head, wherein the analyzing stage is configured to measure and display the amplitude and the phase of the electrical signal converted from the phase modulated laser probe beam by an electro optic effect of the electro optic crystal, wherein the analyzing stage further includes a controller having a computer executable program, wherein when the computer executable program is executed by the controller, the computer executable program causes the controller to automatically measure an intensity of the phase modulated laser probe beam and to automatically send a signal to a motorized rotation stage, causing the motorized rotation stage to adjust the rotation angle of a polarizer such that a phase factor of responsivity can be adjusted and maintained at a value of +1, thereby optimizing and stabilizing the amplitude and the phase of the electrical signal representing the amplitude and the phase of the applied electric field, and wherein the electrical signal representing the amplitude and the phase of the applied electric field is a modulation signal produced by one of the sensor head and the modulator.

17. The system according to claim 16 further including a quarter wave retardation plate held at a fixed angle of forty-five degrees with respect to one of a fast axis and a slow axis of an optical fiber.

18. The system according to claim 16, wherein the controller measures the intensity of the laser probe beam from one of an internal voltmeter and directly from a readout instrument.

19. The system according to claim 18, wherein the controller measures the intensity of the laser probe beam as a function of a rotation angle of the polarizer.

* * * * *